(12) United States Patent
Kojima et al.

(10) Patent No.: US 12,203,991 B2
(45) Date of Patent: Jan. 21, 2025

(54) SUPPORT PLATE AND VOLTAGE DETECTION LINE MODULE

(71) Applicant: SANYO Electric Co., Ltd., Osaka (JP)

(72) Inventors: Yasumasa Kojima, Hyogo (JP); Hiroyuki Mihara, Osaka (JP)

(73) Assignee: SANYO Electric Co., Ltd., Osaka (JP)

(*) Notice: Subject to any disclaimer, the term of this patent is extended or adjusted under 35 U.S.C. 154(b) by 194 days.

(21) Appl. No.: 17/603,616

(22) PCT Filed: Apr. 20, 2020

(86) PCT No.: PCT/JP2020/016987
§ 371 (c)(1),
(2) Date: Oct. 14, 2021

(87) PCT Pub. No.: WO2020/218222
PCT Pub. Date: Oct. 29, 2020

(65) Prior Publication Data
US 2022/0214400 A1  Jul. 7, 2022

(30) Foreign Application Priority Data
Apr. 24, 2019 (JP) ................................ 2019-082597

(51) Int. Cl.
*G01R 31/36* (2020.01)
*G01R 31/3835* (2019.01)
(Continued)

(52) U.S. Cl.
CPC ..... *G01R 31/3644* (2013.01); *G01R 31/3835* (2019.01); *H01M 10/48* (2013.01);
(Continued)

(58) Field of Classification Search
CPC ........... G01R 31/3644; G01R 31/3835; H01M 50/567; H01M 50/50; H01M 50/569;
(Continued)

(56) References Cited

U.S. PATENT DOCUMENTS

2004/0253512 A1* 12/2004 Watanabe ............. H01M 4/131
429/185
2011/0248719 A1* 10/2011 Aoki ................... H01M 10/482
324/426
(Continued)

FOREIGN PATENT DOCUMENTS

CN   109659728 A   4/2019
JP   2017-027831   2/2017
(Continued)

OTHER PUBLICATIONS

The Extended European Search Report dated May 6, 2022, issued in counterpart EP Application No. 20795552.7. (10 pages).
(Continued)

*Primary Examiner* — Alexander Satanovsky
*Assistant Examiner* — Trung Q Nguyen
(74) *Attorney, Agent, or Firm* — WHDA, LLP (57) ABSTRACT

Voltage detection line includes conductive wire, and tab terminal that electrically connects bus bar electrically connected to output terminal of the battery and conductive wire. Support plate includes base plate on which voltage detection line is placed, and position restricting structure of tab terminal. Position restricting structure includes receiving surface part against which tab terminal abuts, and biasing part that pushes tab terminal toward receiving surface part.

4 Claims, 5 Drawing Sheets

(51) Int. Cl.
  *H01M 10/48*  (2006.01)
  *H01M 50/50*  (2021.01)
  *H01M 50/553*  (2021.01)
  *H01M 50/562*  (2021.01)
  *H01M 50/567*  (2021.01)
  *H01M 50/569*  (2021.01)
  *H01M 50/55*  (2021.01)

(52) U.S. Cl.
  CPC ......... *H01M 50/50* (2021.01); *H01M 50/553* (2021.01); *H01M 50/562* (2021.01); *H01M 50/567* (2021.01); *H01M 50/569* (2021.01); *H01M 50/55* (2021.01)

(58) Field of Classification Search
  CPC .. H01M 50/553; H01M 50/562; H01M 10/48; H01M 50/55
  USPC .................................. 324/415–433
  See application file for complete search history.

(56) References Cited

U.S. PATENT DOCUMENTS

| | | | |
|---|---|---|---|
| 2013/0330584 A1* | 12/2013 | Lee | H01M 10/6555 324/426 |
| 2015/0064524 A1 | 3/2015 | Noh et al. | |
| 2017/0008417 A1* | 1/2017 | Yoshida | B60L 53/20 |
| 2018/0164382 A1* | 6/2018 | Kataoka | G01R 31/396 |
| 2018/0219204 A1 | 8/2018 | Takase et al. | |
| 2019/0252739 A1* | 8/2019 | Mizuno | H01M 50/569 |
| 2020/0075916 A1 | 3/2020 | Mori | |
| 2022/0140434 A1* | 5/2022 | Yoshida | H01M 10/6554 429/82 |

FOREIGN PATENT DOCUMENTS

| | | |
|---|---|---|
| WO | 2017/094505 A1 | 6/2017 |
| WO | 2020/045347 A1 | 3/2020 |

OTHER PUBLICATIONS

International Search Report of PCT application No. PCT/JP2020/016987 dated Jun. 30, 2020.

* cited by examiner

SUPPORT PLATE AND VOLTAGE DETECTION LINE MODULE

CROSS-REFERENCE TO RELATED APPLICATIONS

This application is a U.S. national stage application of the PCT International Application No. PCT/JP2020/016987 filed on Apr. 20, 2020, which claims the benefit of foreign priority of Japanese patent application No. 2019-082597 filed on Apr. 24, 2019, the contents all of which are incorporated herein by reference.

TECHNICAL FIELD

The present invention relates to a support plate and a voltage detection line module.

BACKGROUND ART

For example, as a power source for a vehicle or the like that requires a high output voltage, there has been known a battery module formed by electrically connecting a plurality of batteries to each other. In the battery module, neighboring batteries are electrically connected with each other via a bus bar. Additionally, for example, as disclosed in PTL 1, a voltage detection line is attached to each bus bar, and the voltage between the batteries is detected.

CITATION LIST

Patent Literature

PTL 1: Unexamined Japanese Patent Publication No. 2017-27831

SUMMARY OF THE INVENTION

In order to simplify the manufacturing process of a battery module, there is a demand for automating connection of a voltage detection line to a bus bar. In order to achieve the automation, it is effective to employ welding for the connection between the voltage detection line and the bus bar. When the voltage detection line and the bus bar are welded, it is required to accurately position the voltage detection line with respect to the bus bar. However, in the conventional battery module, the positioning accuracy of the voltage detection line is not sufficiently high, and it is sometimes necessary to manually adjust the position of the voltage detection line by the operator.

The present invention has been made in view of such circumstances, and an object of the present invention is to provide a technique that can enhance positioning accuracy of a voltage detection line.

One aspect of the present invention is a support plate. The support plate is a support plate that supports a voltage detection line for detecting a voltage of a battery, in which: the voltage detection line includes a conductive wire, and a tab terminal that electrically connects a bus bar electrically connected to an output terminal of the battery and the conductive wire; the support plate includes a base plate on which the voltage detection line is placed and a position restricting structure of the tab terminal; and the position restricting structure includes a receiving surface part against which the tab terminal abuts, and a biasing part that pushes the tab terminal toward the receiving surface part.

Another aspect of the present invention is a voltage detection line module. The voltage detection line module includes a voltage detection line and the support plate of the above aspect.

Note that any combinations of the above-described constituent elements, and configurations that are obtained by expressing the present invention in the form of method, apparatus, system and the like are also effective as an aspect of the present invention.

According to the present invention, positioning accuracy of a voltage detection line can be enhanced.

DESCRIPTION OF EMBODIMENT

Hereinafter, the present invention will be described on the basis of a preferred exemplary embodiment with reference to the drawings. The exemplary embodiment is an exemplification and does not limit the invention. All technical features described in the exemplary embodiment and combinations of these technical features are not always essential to the invention. The same or equivalent configuration elements, members, and processing illustrated in the drawings are denoted by the same reference numerals, and redundant description will be omitted as appropriate. Additionally, the scale and shape of each part illustrated in each drawing are set for convenience in order to facilitate the description, and are not limitedly interpreted unless otherwise specified. Additionally, when terms such as "first" and "second" are used in the present specification or claims, unless otherwise specified, these terms do not represent any order or importance, and are intended to distinguish one configuration from another configuration. Additionally, in each drawing, some members that are not important for describing the exemplary embodiment are omitted.

Figure 1:
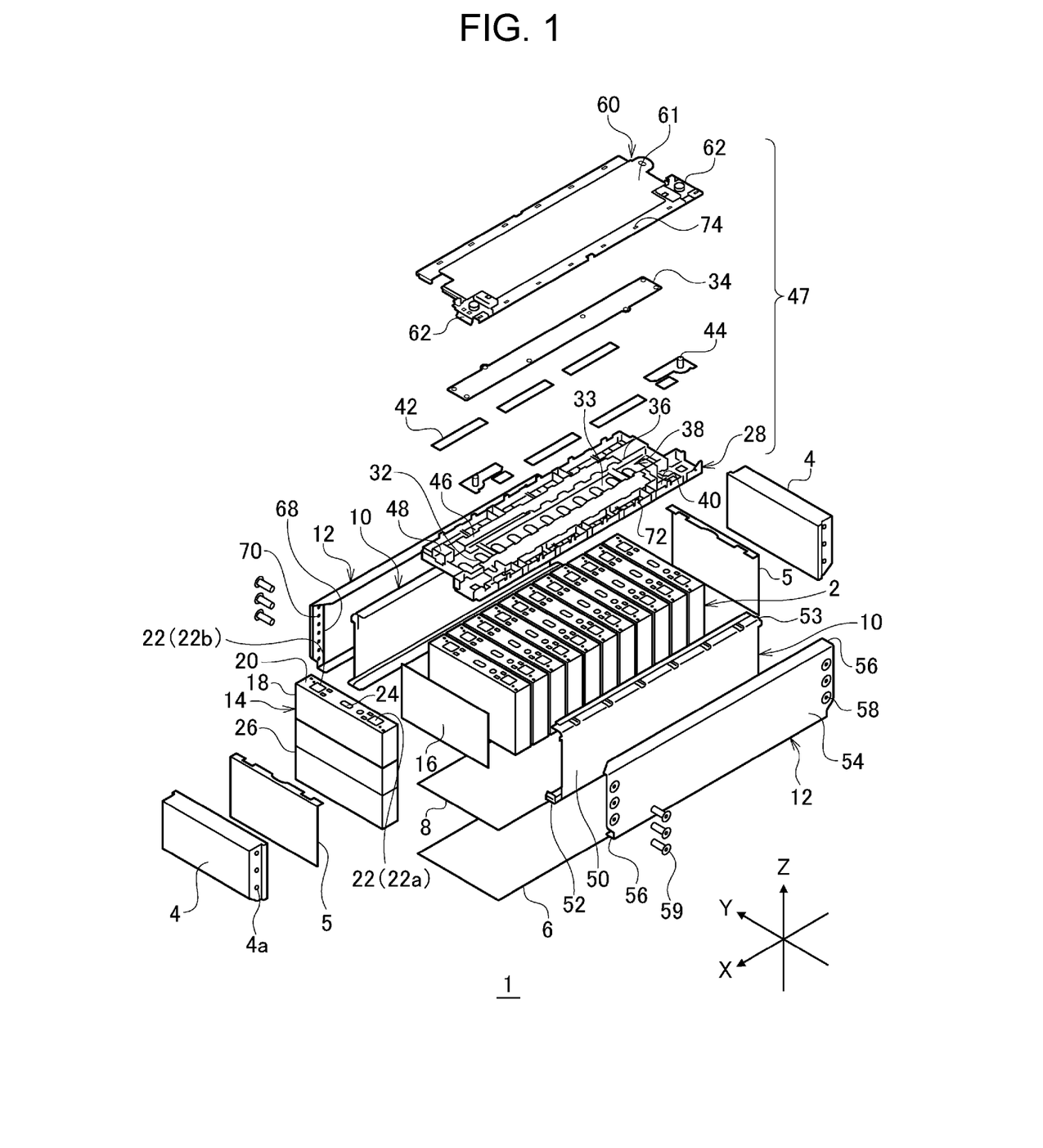
FIG. 1 is an exploded perspective view of a battery module having a support plate according to an exemplary embodiment.
Figure 2:
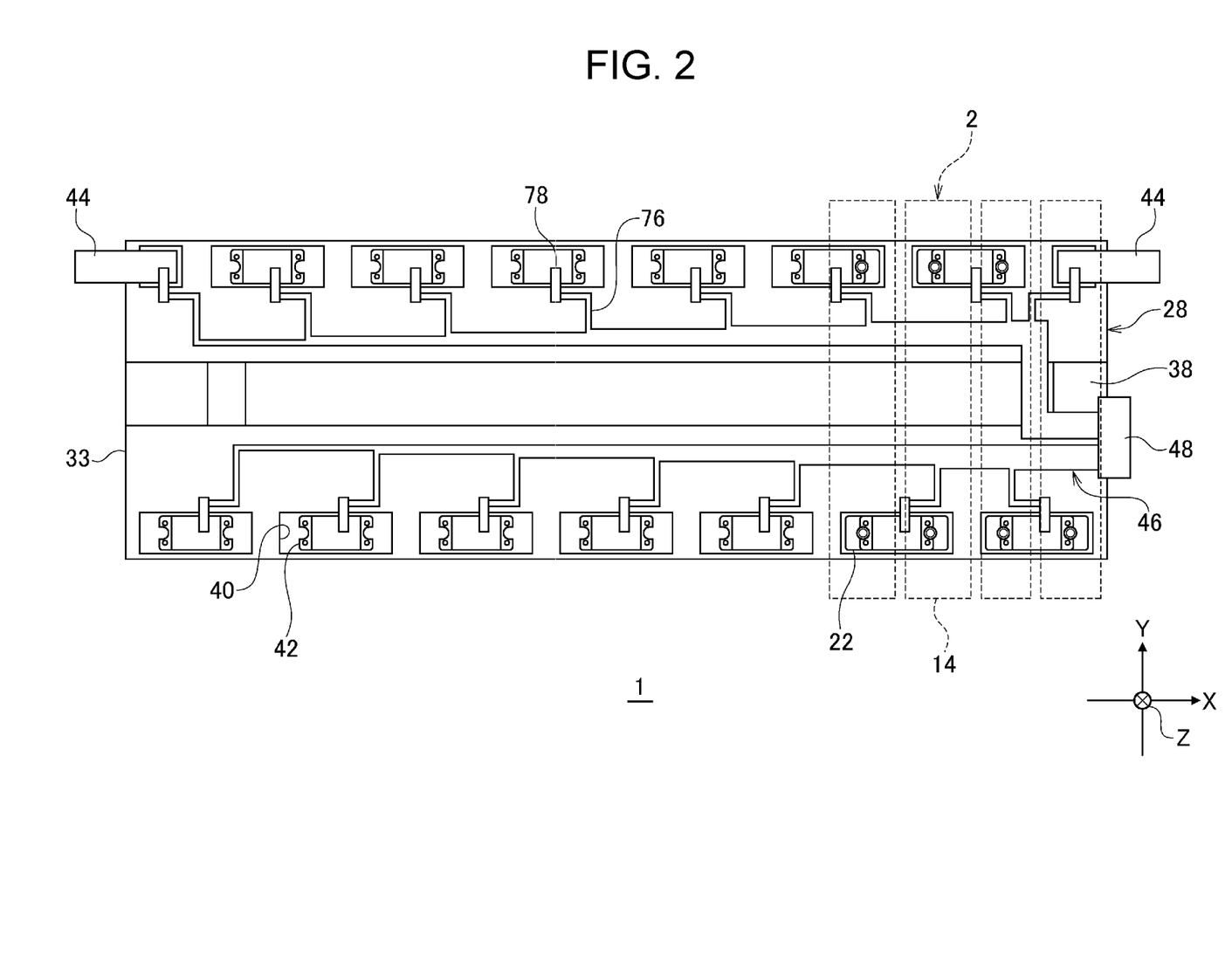
FIG. 2 is a plan view of the battery module.

FIG. 1 is an exploded perspective view of a battery module having a support plate according to an exemplary embodiment. FIG. 2 is a plan view of the battery module. Note that in FIG. 1, output terminal 22, support plate 28, bus bar 42, and voltage detection line 46 are simplified. In FIG. 2, support plate 28 and voltage detection line 46 are simplified, and only some batteries 14 are shown by broken lines. Additionally, side separators 10, constraining member 12, and cover plate 60 are omitted.

Battery module 1 includes battery stack 2, a pair of end plates 4, cooling plate 6, heat conductive layer 8, side separators 10, constraining members 12, support plate 28, voltage detection line 46, and cover plate 60.

Battery stack 2 includes a plurality of batteries 14 and inter-cell separators 16. Each battery 14 is a rechargeable secondary battery such as a lithium-ion battery, a nickel-hydrogen battery, or a nickel-cadmium battery, for example.

Additionally, each battery 14 is a so-called prismatic battery, and has exterior can 18 having a flat rectangular-parallelepiped shape. Exterior can 18 has a substantially rectangular opening (not illustrated) on one surface of exterior can 18. An electrode assembly, an electrolyte, and the like are housed in exterior can 18 through the opening. Sealing plate 20 that closes the opening of exterior can 18 is disposed in the opening.

Output terminal 22 of a positive electrode is disposed on sealing plate 20 at a position close to one end of sealing plate 20 in a longitudinal direction, and output terminal 22 of a negative electrode is disposed on sealing plate 20 at a position close to the other end of sealing plate 20 in the longitudinal direction. The pair of output terminals 22 are respectively electrically connected to positive electrode plates and negative electrode plates that form the electrode assembly. Hereinafter, output terminal 22 of the positive electrode is referred to as positive-electrode terminal 22$a$, and output terminal 22 of the negative electrode is referred to as negative-electrode terminal 22$b$ as appropriate. Additionally, when there is no need to distinguish polarities of output terminals 22 from each other, positive-electrode terminal 22$a$ and negative-electrode terminal 22$b$ are collectively referred to as output terminals 22.

Exterior can 18, sealing plate 20, and output terminals 22 are electric conductors and are made of metal, for example. Sealing plate 20 and the opening of exterior can 18 are joined to each other by, for example, laser welding. Each output terminal 22 is inserted into a through-hole (not illustrated) formed in sealing plate 20. A seal member (not illustrated) having an insulating property is interposed between each output terminal 22 and the through-hole.

In the description of the present exemplary embodiment, for convenience, sealing plate 20 is referred to as an upper surface of battery 14, and a bottom surface of exterior can 18 disposed on a side opposite to sealing plate 20 is referred to as a lower surface of battery 14. Additionally, battery 14 has two main surfaces that connect the upper surface and the lower surface of battery 14 to each other. The main surfaces are surfaces that have the largest area among six surfaces of battery 14. Additionally, the main surfaces are long side surfaces that are connected to long sides of the upper surface and long sides of the lower surface. Two remaining surfaces other than the upper surface, the lower surface, and the two main surfaces are referred to as side surfaces of battery 14. These side surfaces are a pair of short side surfaces that are connected to short sides of the upper surface and short sides of the lower surface.

Additionally, for convenience, in battery stack 2, surfaces of batteries 14 closer to an upper surface are referred to as an upper surface of battery stack 2, surfaces of batteries 14 closer to a lower surface are referred to as a lower surface of battery stack 2, and surfaces of batteries 14 closer to side surface are referred to as side surfaces of battery stack 2. These directions and positions are defined for convenience unless otherwise specified. Accordingly, for example, the part defined as the upper surface in the present invention is not always positioned above the part defined as the lower surface.

Valve 24 is disposed on sealing plate 20 between the pair of output terminals 22. Valve 24 is also referred to as a safety valve. Valve 24 is a mechanism which allows each battery 14 to blow off a gas in battery 14. Valve 24 is configured to release the internal gas by opening valve 24 when the internal pressure of exterior can 18 is increased to a predetermined value or more. For example, valve 24 is formed of: a thin part that is formed on a part of sealing plate 20 and is thinner than other parts of valve 24; and a linear groove formed on a surface of the thin part. In this configuration, when the internal pressure of exterior can 18 increases, the thin part is torn from the groove to open valve 24. Valves 24 of batteries 14 are connected to exhaust duct 38 described later, and the gas in the battery is discharged from valve 24 to exhaust duct 38.

Additionally, each battery 14 has insulating film 26. Insulating film 26 is, for example, a cylindrical shrink tube, and is heated after exterior can 18 is inserted in insulating film 26. As a result, insulating film 26 shrinks and covers two main surfaces, two side surfaces, and a bottom surface of exterior can 18. Insulating film 26 can prevent a short circuit between adjacent batteries 14 or a short circuit between battery 14 and end plate 4 or constraining member 12.

The plurality of batteries 14 are stacked at predetermined intervals with the main surfaces of adjacent batteries 14 facing each other. Note that the term "stack" means that a plurality of members are arranged in any one direction. Accordingly, stacking of batteries 14 also includes an arrangement of the plurality of batteries 14 in a horizontal direction. In the present exemplary embodiment, batteries 14 are stacked horizontally. Accordingly, stacking direction X of batteries 14 is a direction extending horizontally. Hereinafter, when appropriate, a direction that is horizontal and is perpendicular to stacking direction X is referred to as horizontal direction Y, and a direction that is perpendicular to stacking direction X and horizontal direction Y is referred to as vertical direction Z.

Additionally, batteries 14 are disposed in a state where output terminals 22 are directed in the same direction. In the present exemplary embodiment, batteries 14 are disposed in a state where output terminals 22 are directed upward in the vertical direction. Additionally, when adjacent batteries 14 are connected in series, batteries 14 are stacked such that positive-electrode terminal 22$a$ of one battery 14 and negative-electrode terminal 22$b$ of another battery 14 are disposed adjacently to each other. Additionally, when adjacent batteries 14 are connected in parallel, batteries 14 are stacked such that positive-electrode terminal 22$a$ of one battery 14 and positive-electrode terminal 22$a$ of another battery 14 are disposed adjacently to each other.

Inter-cell separator 16 is also referred to as an insulating spacer, and is formed of a resin sheet having an insulating property, for example. Examples of the resin used for forming inter-cell separator 16 include thermoplastic resins such as polypropylene (PP), polybutylene terephthalate (PBT), polycarbonate (PC), and Noryl (registered trademark) resin (modified PPE). Inter-cell separator 16 is disposed between two adjacent batteries 14 to electrically insulate two batteries 14 from each other.

Battery stack 2 is sandwiched between the pair of end plates 4 in stacking direction X of batteries 14. The pair of end plates 4 are disposed at both ends of battery stack 2 in stacking direction X of batteries 14. The pair of end plates 4 are disposed adjacently to batteries 14 positioned at both ends of battery stack 2 in stacking direction X with external end separator 5 interposed between end plate 4 and battery 14. External end separator 5 can be made of the same resin material as inter-cell separator 16. Each end plate 4 is a metal sheet made of metal such as iron, stainless steel, or aluminum. By interposing external end separator 5 between end plate 4 and battery 14, end plate 4 and battery 14 are electrically insulated from each other. Each end plate 4 has fastening holes 4$a$ on two surfaces that are directed in horizontal direction Y.

Support plate 28 is placed on the upper surface of battery stack 2. Support plate 28 is a plate-shaped member that supports voltage detection line 46. Voltage detection line 46 is a member for detecting the voltage of battery 14. Support plate 28 includes base plate 33 extending along the upper surface of battery stack 2, and voltage detection line 46 is placed on base plate 33.

Base plate 33 covers the upper surface of battery stack 2, that is, a surface on which valve 24 of each battery 14 is disposed. Base plate 33 has a plurality of openings 32 through which valves 24 are exposed at positions corresponding to valves 24 formed on respective batteries 14. Additionally, support plate 28 has exhaust duct 38 that temporarily stores the gas blown off from batteries 14. Accordingly, support plate 28 also functions as a so-called duct plate. Exhaust duct 38 extends in stacking direction X of batteries 14 and is connected to valves 24 of respective batteries 14. Each valve 24 communicates with exhaust duct 38 through opening 32.

Exhaust duct 38 is defined by: first wall part 34 that covers the upper sides of the plurality of openings 32; and a pair of second wall parts 36 which surround the sides of openings 32. The pair of second wall parts 36 are arranged in horizontal direction Y with the plurality of openings 32 interposed between the pair of second wall parts 36. First wall part 34 faces valves 24. The pair of second wall parts 36 protrude from base plate 33 toward cover plate 60, and form both side surfaces of exhaust duct 38. First wall part 34 is fixed to upper ends of the pair of second wall parts 36 to form a top surface of exhaust duct 38.

Additionally, base plate 33 has openings 40 through which output terminals 22 are exposed at positions corresponding to output terminals 22 of batteries 14. Bus bars 42 are placed on respective openings 40. The plurality of bus bars 42 are supported by support plate 28. Accordingly, support plate 28 also functions as a so-called bus bar plate. Bus bar 42 placed on each opening 40 electrically connects output terminals 22 of adjacent batteries 14.

Support plate 28 of the present exemplary embodiment is made of a resin such as polypropylene (PP), polybutylene terephthalate (PBT), polycarbonate (PC), and Noryl (registered trademark) resin (modified PPE) except for first wall part 34. First wall part 34 is made of metal such as iron or aluminum. Additionally, the pair of second wall parts 36 are integrally formed with base plate 33 by molding. First wall part 34 is fixed to the pair of second wall parts 36 by fastening members (not illustrated) such as screws.

Bus bar 42 is a substantially strip-shaped member made of metal such as copper or aluminum. One end of bus bar 42 is connected to output terminal 22 of one battery 14, and the other end of bus bar 42 is connected to output terminal 22 of another battery 14. Bus bar 42 and output terminal 22 are joined by laser welding, for example. Bus bars 42 may connect output terminals 22 of the same polarity of a plurality of adjacent batteries 14 in parallel to form a battery block, and bus bars 42 may connect the battery blocks in series. Each of bus bars 42 connected to output terminals 22 of batteries 14 positioned at both ends in stacking direction X has external connection terminal 44. External connection terminal 44 is connected to an external load (not illustrated).

Voltage detection line 46 placed on base plate 33 of support plate 28 is electrically connected to the plurality of bus bars 42 to detect the voltage of each battery 14. Voltage detection line 46 has a plurality of conductive wires 76 and a plurality of tab terminals 78. The plurality of conductive wires 76 are associated with respective bus bars 42. One end of each conductive wire 76 is electrically connected to corresponding bus bar 42 by tab terminal 78. Each tab terminal 78 has a substantial strip shape, and one end of tab terminal 78 is placed on bus bar 42 and is joined to bus bar 42 by laser welding, for example. The other end of each tab terminal 78 is joined to conductive wire 76 by clinching or soldering, for example.

The other end of conductive wire 76 is connected to connector 48. Connector 48 is connected to an external battery ECU (not illustrated) or the like. The Battery ECU controls detection of the voltage or the like of each battery 14, charging and discharging of each battery 14, and the like. Additionally, some of the conductive wires 76 electrically connect external connection terminal 44 and connector 48.

Cooling plate 6 has a flat plate shape extending in stacking direction X and in horizontal direction Y, and is made of a material having a high heat transfer property such as aluminum. Cooling plate 6 is connected to battery stack 2 in a heat-exchangeable manner to cool batteries 14. Battery stack 2 is placed on cooling plate 6 with the lower surface of battery stack 2 facing cooling plate 6. Cooling plate 6 may be connected to the outside of battery module 1 in a heat-exchangeable manner. Additionally, a flow path through which a refrigerant such as water or ethylene glycol flows may be formed in cooling plate 6.

Heat conductive layer 8 is an insulative member interposed between battery stack 2 and cooling plate 6. Heat conductive layer 8 covers the entire bottom surface of battery stack 2. Heat conductive layer 8 can be formed of, for example, a known resin sheet having a good heat transfer property, such as an acrylic rubber sheet or a silicone rubber sheet. Additionally, heat conductive layer 8 may be made of a known adhesive agent, grease, or the like having a good heat transfer property and a good insulating property. Note that when exterior can 18 is sufficiently insulated by insulating film 26 or the like, heat conductive layer 8 does not need to have an insulating property.

Side separators 10 are members that have an insulating property and insulate constraining member 12 and battery stack 2 from each other. In the present exemplary embodiment, the pair of side separators 10 are arranged in horizontal direction Y. Battery stack 2, the pair of end plates 4, cooling plate 6, and heat conductive layer 8 are disposed between the pair of side separators 10. Each side separator 10 is made of, for example, a resin having an insulating property. Examples of the resin forming side separator 10 include the same thermoplastic resin as inter-cell separator 16.

Side separator 10 of the present exemplary embodiment has first part 50, second part 52, and third part 53. First part 50 has a rectangular flat plate shape, and extends in stacking direction X of batteries 14 along the side surface of battery stack 2. Second part 52 has a strip shape extending in stacking direction X, and protrudes toward battery stack 2 from a lower side of first part 50. Third part 53 has a strip shape extending in stacking direction X, and protrudes toward battery stack 2 from an upper side of first part 50. Battery stack 2, cooling plate 6, and heat conductive layer 8 are disposed between second part 52 and third part 53.

Constraining member 12 is also referred to as a bind bar, and is an elongated member that is long in stacking direction X of batteries 14. In the present exemplary embodiment, the pair of constraining members 12 are arranged in horizontal direction Y. Each constraining member 12 is made of metal. Examples of metal used for forming constraining member 12 include iron, stainless steel, and the like. Battery stack 2, the pair of end plates 4, cooling plate 6, heat conductive layer 8, and the pair of side separators 10 are disposed between the pair of constraining members 12.

In the present exemplary embodiment, constraining member 12 has flat surface part 54 and a pair of arm parts 56. Flat surface part 54 has a rectangular shape, and extends in stacking direction X along the side surface of battery stack 2. The pair of arm parts 56 protrude toward battery stack 2 from ends of flat surface part 54 on both sides in vertical direction Z. Battery stack 2, cooling plate 6, heat conductive layer 8, and side separator 10 are disposed between the pair of arm parts 56.

Contact plate 68 is fixed to a region of flat surface part 54 that faces each end plate 4 by welding or the like. Contact plate 68 is provided with through-holes 70 at positions corresponding to fastening holes 4a of end plate 4. Additionally, flat surface part 54 has through-holes 58 at positions corresponding to through-holes 70 of contact plate 68.

By making the pair of end plates 4 engage with flat surface parts 54 of respective constraining members 12, the plurality of batteries 14 are sandwiched between end plates 4 in stacking direction X. Specifically, battery stack 2 is formed by alternately arranging the plurality of batteries 14 and the plurality of inter-cell separators 16, and such battery stack 2 is sandwiched between the pair of end plates 4 in stacking direction X with external end separators 5 interposed between battery stack 2 and end plates 4. Additionally, heat conductive layer 8 and cooling plate 6 are disposed on a lower surface of battery stack 2. In such a state, battery stack 2, the pair of end plates 4, cooling plate 6, and heat conductive layer 8 are sandwiched between the pair of side separators 10 in horizontal direction Y. Further, the pair of constraining members 12 sandwich the whole body in horizontal direction Y from the outside of the pair of side separators 10.

The pair of end plates 4 and the pair of constraining members 12 are positioned with respect to each other such that fastening holes 4a, through-holes 70, and through-holes 58 are aligned. Then, fastening members 59 such as screws are inserted into through-holes 58 and through-holes 70 to be threadedly engaged with fastening holes 4a. As a result, the pair of end plates 4 and the pair of constraining members 12 are fixed to each other. By engaging the pair of end plates 4 with the pair of constraining members 12, the plurality of batteries 14 are clamped and constrained in stacking direction X.

Additionally, constraining members 12 sandwich the plurality of batteries 14 in stacking direction X. Constraining members 12 also sandwich battery stack 2, heat conductive layer 8, and cooling plate 6 in the arrangement direction of battery stack 2, heat conductive layer 8, and cooling plate 6. Specifically, battery stack 2, heat conductive layer 8, and cooling plate 6 are sandwiched between the pair of arm parts 56 of constraining member 12 in vertical direction Z. That is, constraining members 12 have both a function of fastening the plurality of batteries 14 and a function of fastening battery stack 2 and cooling plate 6.

In a state where the pair of constraining members 12 are fixed to the pair of end plates 4, first part 50 of side separator 10 is interposed between the side surface of battery stack 2 and flat surface part 54 of constraining member 12. As a result, the side surfaces of batteries 14 and flat surface part 54 are electrically insulated from each other. Second part 52 of side separator 10 is interposed between cooling plate 6 and lower arm part 56 of constraining member 12. As a result, cooling plate 6 and lower arm part 56 of constraining member 12 are electrically insulated from each other. Third part 53 of side separator 10 is interposed between the upper surface of battery stack 2 and upper arm part 56 of constraining member 12. As a result, the upper surfaces of batteries 14 and upper arm part 56 of constraining member 12 are electrically insulated from each other.

As an example, after assembly of these constituent elements is completed, support plate 28 is placed on battery stack 2. Support plate 28 is fixed to battery stack 2 by engaging third parts 53 of the pair of side separators 10 with support plate 28. Then, bus bar 42 is placed on output terminals 22 of batteries 14. Additionally, voltage detection line 46 is placed on support plate 28. Subsequently, conductive wire 76 of voltage detection line 46 is electrically connected to each bus bar 42. Thereafter, each bus bar 42 is electrically connected to output terminals 22.

Cover plate 60 is placed on an upper surface of support plate 28. Cover plate 60 is a plate-shaped member that is placed on support plate 28 to cover voltage detection line 46. Cover plate 60 of the present exemplary embodiment is a so-called top cover that forms a part of an outer shell of battery module 1, specifically, the upper surface of battery module 1. Cover plate 60 prevents contact of dew water, dust, or the like with output terminals 22 and valves 24 of batteries 14, bus bars 42, voltage detection line 46, and the like.

Cover plate 60 is made of a resin having an insulating property such as polypropylene (PP), polybutylene terephthalate (PBT), polycarbonate (PC), and Noryl (registered trademark) resin (modified PPE), for example. Cover plate 60 has insulating cover parts 62 at positions overlapping external connection terminals 44 in vertical direction Z. In a state where cover plate 60 is placed on support plate 28, external connection terminals 44 are covered with insulating cover parts 62.

Both ends of cover plate 60 in horizontal direction Y are fixed to support plate 28. Support plate 28 of the present exemplary embodiment has a plurality of engaging claws 72 spaced apart in stacking direction X at both ends of support plate 28 in horizontal direction Y. Additionally, cover plate 60 has engagement holes 74 at positions overlapping respective engaging claws 72 as viewed in vertical direction Z in base plate 61 extending along the upper surface of battery stack 2. When cover plate 60 is placed on support plate 28, engaging claws 72 are inserted into respective engagement holes 74. As a result, both ends of cover plate 60 in horizontal direction Y are fixed to support plate 28 by snap-fitting. Support plate 28, voltage detection line 46, and cover plate 60 form voltage detection line module 47.

Tab terminal 78 is joined to a substantially central part of bus bar 42 in stacking direction X. Alternatively, tab terminal 78 is joined to a region of bus bar 42 that straddles two batteries 14. As a result, the amount of displacement of a joint between tab terminal 78 and bus bar 42 due to expansion and contraction of batteries 14 can be reduced. Hence, the connection state between tab terminal 78 and bus bar 42 can be maintained more stably.

Figure 3:
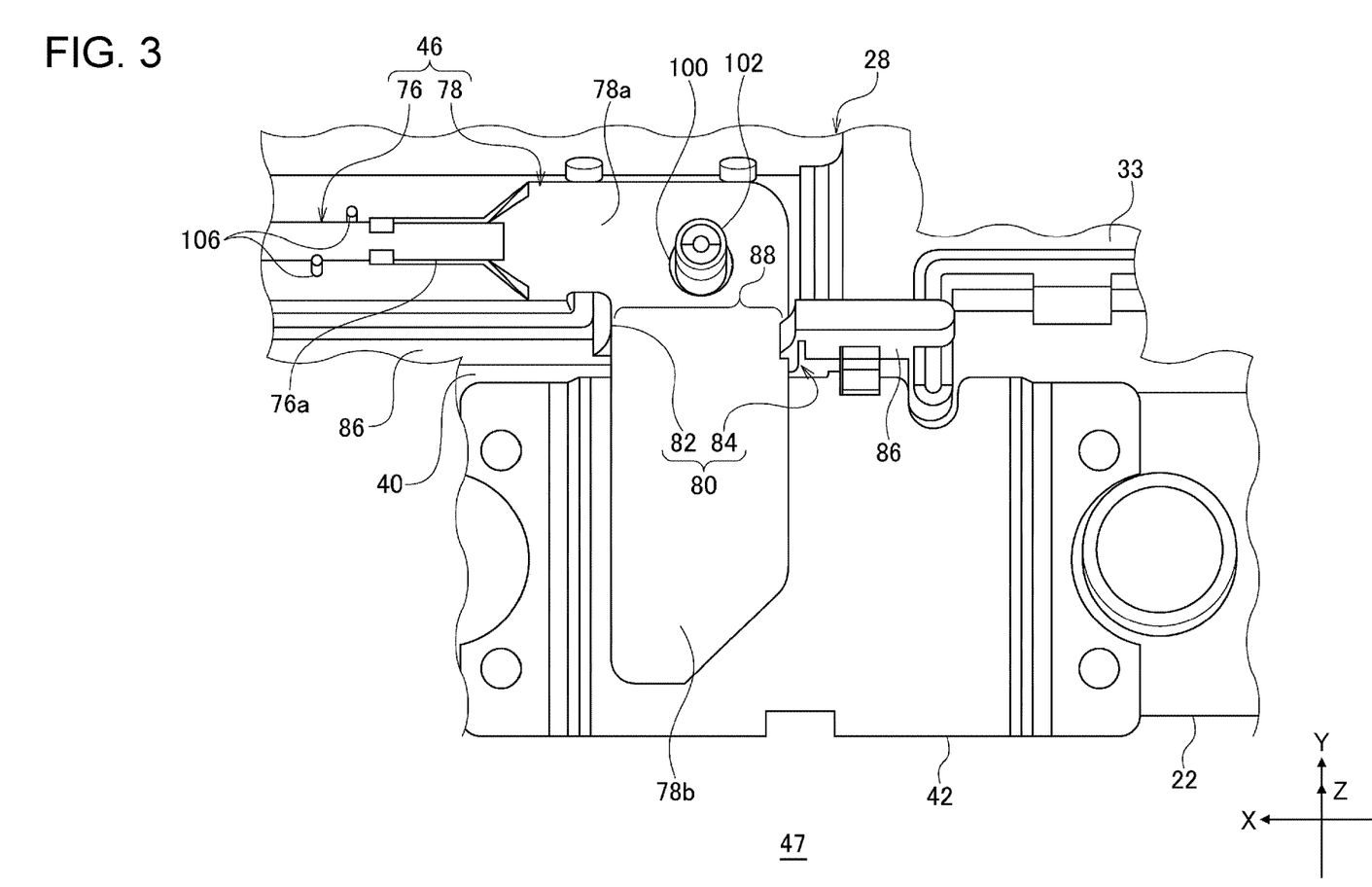
FIG. 3 is a perspective view of a region including a tab terminal in a voltage detection line module according to the exemplary embodiment.
Figure 4:
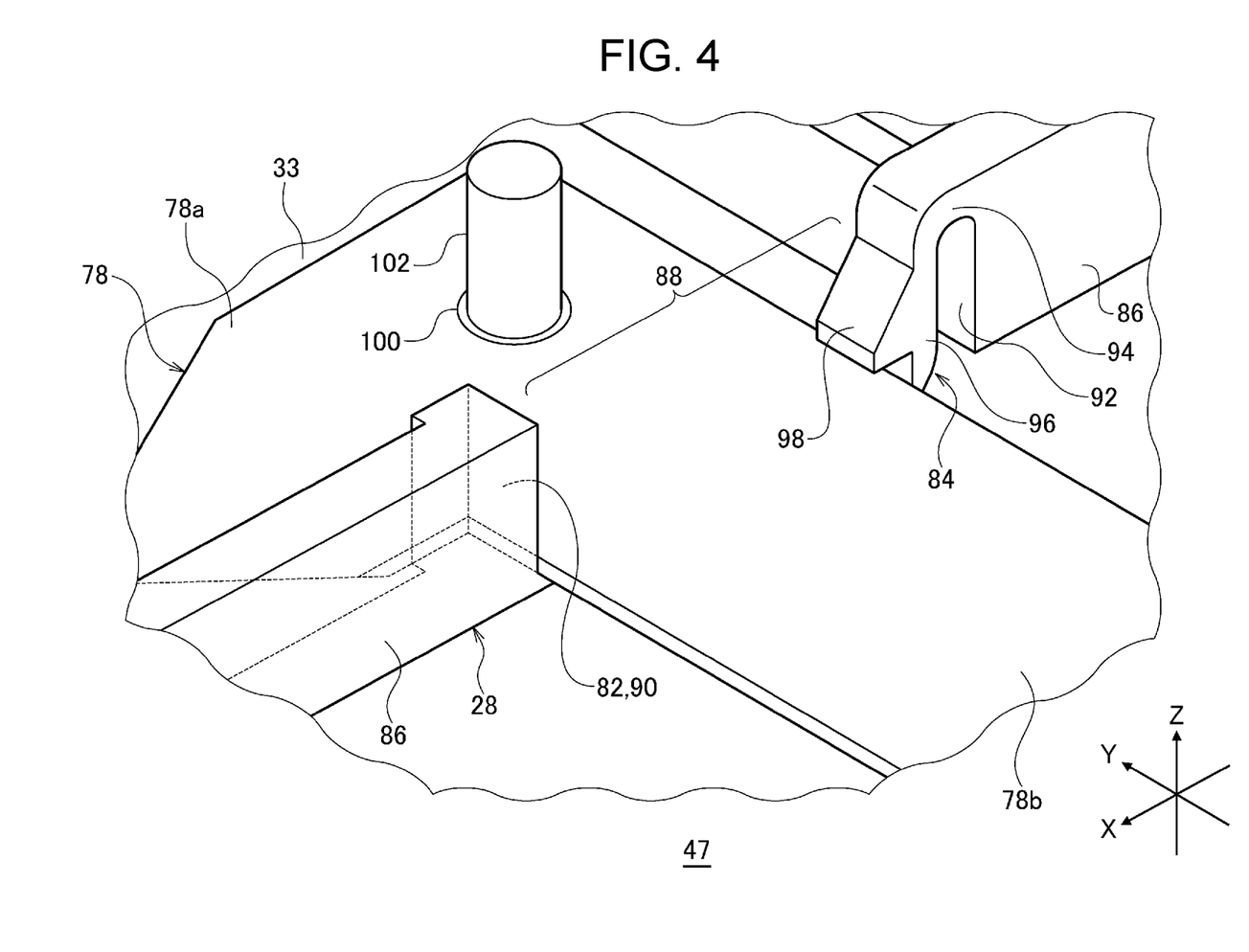
FIG. 4 is a perspective view schematically illustrating a region including the tab terminal in the voltage detection line module.

FIG. 3 is a perspective view of a region including tab terminal 78 in voltage detection line module 47 according to the exemplary embodiment. FIG. 4 is a perspective view schematically illustrating a region including tab terminal 78 in voltage detection line module 47. Note that in FIGS. 3 and 4, cover plate 60 is omitted.

Support plate 28 includes position restricting structure 80 that determines the position of tab terminal 78. Position restricting structure 80 has receiving surface part 82 against which tab terminal 78 abuts, and biasing part 84 that pushes tab terminal 78 toward receiving surface part 82.

Conductive wire 76 of the present exemplary embodiment has connection end 76a connected to tab terminal 78. Connection end 76a extends along an edge of opening 40. Additionally, tab terminal 78 has fixing part 78a fixed to connection end 76a and joint 78b joined to bus bar 42. Fixing part 78a extends in a first direction in which connection end 76a extends. One end side of fixing part 78a is fixed to connection end 76a by clinching, for example. Joint 78b extends from the other end of fixing part 78a in a second direction intersecting the first direction in which connection end 76a extends. Accordingly, tab terminal 78 has a rough L shape.

The base ends of connection end 76a, fixing part 78a, and joint 78b are placed on base plate 33. The tip end of joint 78b overlaps bus bar 42 in vertical direction Z and is welded to bus bar 42. In the present exemplary embodiment, the first direction corresponds to stacking direction X and the second direction corresponds to horizontal direction Y. Additionally, tab terminal 78 has opening 100 in a region (corner of L shape) where fixing part 78a and joint 78b are connected to each other. Base plate 33 has locking projection 102 at a position overlapping opening 100 in vertical direction Z.

Receiving surface part 82 and biasing part 84 are disposed so as to sandwich joint 78b in the first direction. Specifically, base plate 33 has wall part 86 extending along an edge of opening 40. Wall part 86 is provided with cutout 88, and joint 78b protrudes into opening 40 through cutout 88. Wall part 86 has first side surface 90 and second side surface 92 facing each other with cutout 88 interposed between first side surface 90 and second side surface 92. First side surface 90 forms receiving surface part 82.

Biasing part 84 is provided on second side surface 92. Biasing part 84 has support part 94 protruding toward first side surface 90 from the upper end of second side surface 92, and hanging part 96 extending vertically downward from the tip end of support part 94. Hanging part 96 is separated from second side surface 92 by the protruding amount of support part 94. Accordingly, biasing part 84 has a spring structure including support part 94 and hanging part 96. Base plate 33, wall part 86, and biasing part 84 of the present exemplary embodiment are integrally molded of resin.

Biasing part 84 has eaves part 98 protruding toward first side surface 90 on a surface of hanging part 96 facing first side surface 90. Eaves part 98 overlaps joint 78b of tab terminal 78 when viewed in a third direction in which base plate 33 and voltage detection line 46 are arranged. In the present exemplary embodiment, the third direction corresponds to vertical direction Z. Eaves part 98 protrudes such that the amount of protrusion toward first side surface 90 gradually increases from cover plate 60 toward support plate 28.

Tab terminal 78 is placed on base plate 33 while being positioned such that opening 100 overlaps locking projection 102. At this time, locking projection 102 is inserted into opening 100, and the attitude of tab terminal 78 with respect to base plate 33 is roughly determined. In the process of placing tab terminal 78 on base plate 33, joint 78b is pushed into cutout 88 from the vertically upper side. At this time, the edge of joint 78b comes into contact with eaves part 98, and biasing part 84 is pushed toward second side surface 92. As a result, the lower end of hanging part 96 is displaced in a direction approaching second side surface 92 with support part 94 as a fulcrum. Consequently, the gap between biasing part 84 and receiving surface part 82 is increased, and joint 78b is sandwiched between biasing part 84 and receiving surface part 82.

When joint 78b goes past eaves part 98, the force by which joint 78b pushes eaves part 98 is canceled, and biasing part 84 is displaced in a direction separating from second side surface 92 by the elastic force of biasing part 84 itself. As a result, hanging part 96 comes into contact with joint 78b and presses joint 78b against receiving surface part 82. Consequently, joint 78b is fixed to base plate 33, and displacement of joint 78b is restricted. The protruding amount of biasing part 84 toward receiving surface part 82 is set such that, in a state where joint 78b is not fitted into cutout 88, the distance between hanging part 96 and receiving surface part 82 is smaller than the dimension of a part of joint 78b sandwiched between hanging part 96 and receiving surface part 82. As a result, joint 78b can be pressed against receiving surface part 82 more reliably.

Subsequently, bus bar 42 is pressed against output terminals 22 by a welding jig. In this state, a region of joint 78b overlapping bus bar 42 is irradiated with a laser beam, and joint 78b is welded to bus bar 42. Thereafter, a region of bus bar 42 overlapping output terminals 22 is irradiated with a laser beam, and bus bar 42 is welded to output terminals 22. After bus bar 42 is welded, cover plate 60 is attached to support plate 28.

Figure 5:
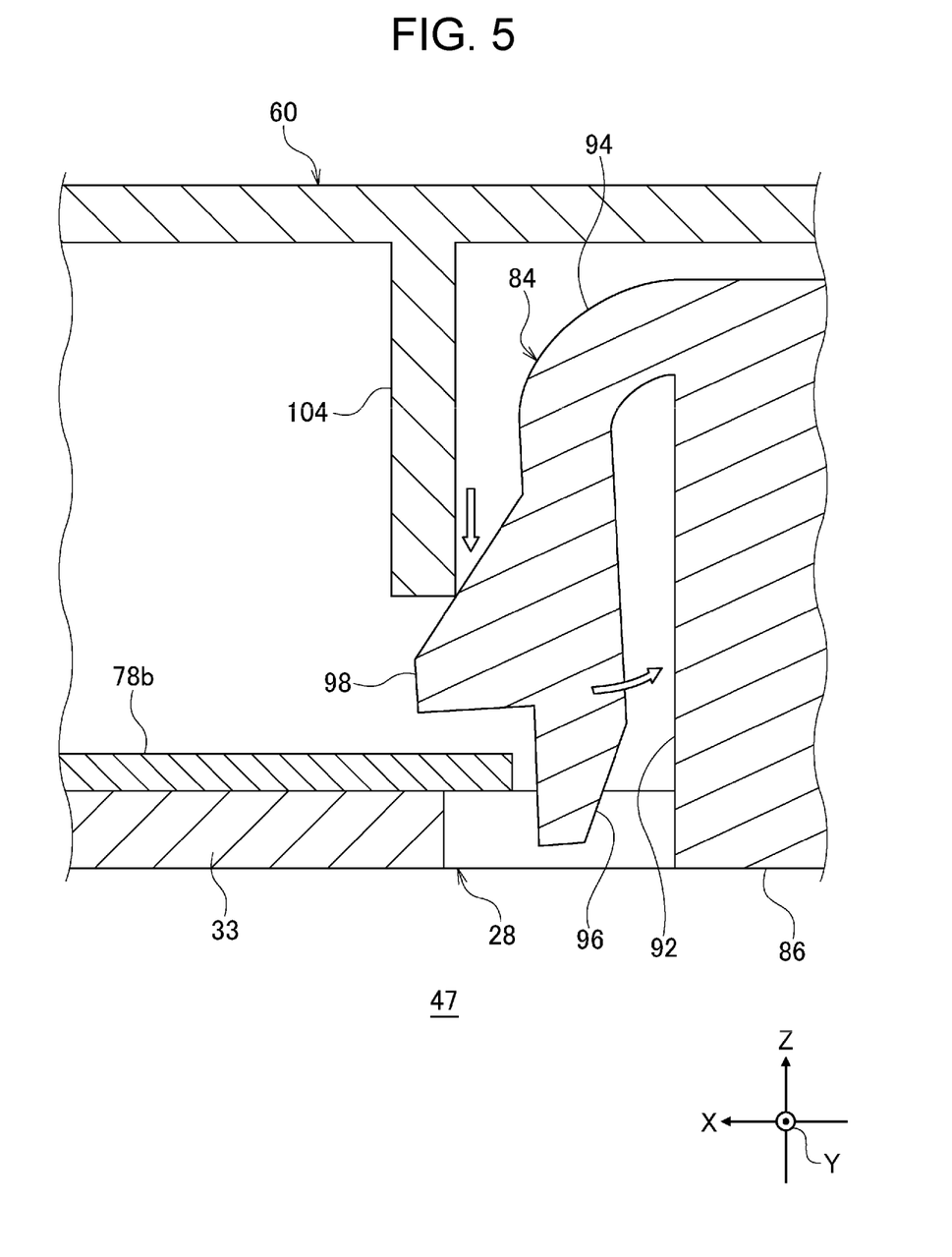
FIG. 5 is a cross-sectional view schematically illustrating a region including the tab terminal in the voltage detection line module.

FIG. 5 is a cross-sectional view schematically illustrating a region including tab terminal 78 in voltage detection line module 47. Cover plate 60 of the present exemplary embodiment has protrusion 104 protruding toward support plate 28. Base plate 61 and protrusion 104 of the present exemplary embodiment are integrally molded of resin. Protrusion 104 is disposed so as to overlap eaves part 98 in vertical direction Z. In a state where cover plate 60 is placed on support plate 28, the tip end of protrusion 104 abuts on eaves part 98. Then, protrusion 104 pushes biasing part 84 toward second side surface 92 against the biasing force of biasing part 84. As a result, the surface of hanging part 96 directed toward receiving surface part 82 is separated from joint 78b.

As illustrated in FIG. 3, support plate 28 of the present exemplary embodiment has positioning projections 106. Positioning projections 106 are disposed in a region of base plate 33 where conductive wire 76 is laid, and protrude toward cover plate 60. When voltage detection line 46 is placed on support plate 28, a part of conductive wire 76 in the vicinity of connection end 76a is positioned with positioning projections 106. As a result, even when conductive wire 76 has a bending tendency, the extending direction of conductive wire 76 and connection end 76a can be restricted. Hence, joint 78b can be pressed against receiving surface part 82 more reliably by biasing part 84.

As described above, support plate 28 according to the present exemplary embodiment includes base plate 33 on which voltage detection line 46 is placed, and position restricting structure 80 that restricts the position of tab terminal 78 of voltage detection line 46. Position restricting structure 80 has receiving surface part 82 against which tab terminal 78 abuts, and biasing part 84 that pushes tab terminal 78 toward receiving surface part 82. Additionally, voltage detection line module 47 of the present exemplary embodiment includes support plate 28 and voltage detection line 46. As a result, positioning accuracy of voltage detection line 46 can be enhanced. More specifically, tab terminal 78 can be positioned accurately with respect to bus bar 42.

By positioning tab terminal 78 accurately with respect to bus bar 42, it is possible to avoid overlap of tab terminal 78 with a position on bus bar 42 where the welding jig is applied or a position where bus bar 42 and output terminal 22 are welded. Accordingly, manual adjustment of the position of tab terminal 78 by the operator can be omitted.

Hence, welding can be adopted as a method of connecting voltage detection line 46 and bus bar 42, and the connection of voltage detection line 46 to bus bar 42 can be automated. Consequently, the manufacturing process of battery module 1 can be simplified, and the cost of battery module 1 can be reduced.

Note that as a method of avoiding overlap of tab terminal 78 with a position on bus bar 42 where the welding jig is applied or a welding position of bus bar 42 and output terminal 22, it is conceivable to reduce the size of tab terminal 78. However, in this case, the welding area between tab terminal 78 and bus bar 42 may be reduced to lower the joining strength. On the other hand, according to the present exemplary embodiment, the manufacturing process of battery module 1 can be simplified while maintaining the joining strength between tab terminal 78 and bus bar 42.

Additionally, tab terminal 78 of the present exemplary embodiment has joint 78b that extends in the second direction intersecting the first direction in which connection end 76a of conductive wire 76 extends and is joined to bus bar 42. Then, receiving surface part 82 and biasing part 84 sandwich joint 78b in the first direction. With such a structure, the positioning accuracy of tab terminal 78 can be enhanced even more.

Additionally, biasing part 84 of the present exemplary embodiment has eaves part 98 overlapping tab terminal 78 when viewed in the third direction in which base plate 33 and voltage detection line 46 are arranged. As a result, displacement of tab terminal 78 in a direction separating from base plate 33 can be restricted. Hence, the positioning accuracy of tab terminal 78 can be enhanced even more.

Additionally, voltage detection line module 47 of the present exemplary embodiment includes cover plate 60 that is placed on support plate 28 and covers voltage detection line 46. Cover plate 60 has protrusion 104 that presses biasing part 84 against its biasing force when cover plate 60 is placed on support plate 28. As a result, biasing part 84 that is no longer required to press tab terminal 78 against receiving surface part 82 after tab terminal 78 is welded to bus bar 42 can be separated from tab terminal 78. Consequently, it is possible to avoid generation of dust due to scraping of biasing part 84 caused by friction between metal tab terminal 78 and resin biasing part 84.

The exemplary embodiment of the present invention has been described in detail above. The above-described exemplary embodiment is merely a specific example for carrying out the present invention. The contents of the exemplary embodiment do not limit the technical scope of the present invention, and many design changes such as changes, additions, and deletions of constituent elements can be made without departing from the spirit of the invention defined in claims. Novel exemplary embodiments with a design change acquire both advantageous effects of the exemplary embodiment and the modification that are combined with each other. In the above-described exemplary embodiment, the contents where such design changes are allowable are emphasized with expressions such as "of the present exemplary embodiment" and "in the present exemplary embodiment". However, the design changes are also allowable in the contents which are not emphasized with such expressions. Any combination of constituent elements included in the exemplary embodiment is also effective as an aspect of the present invention. Hatching applied to cross sections in the drawings does not limit the material of the hatched object.

The exemplary embodiment may be specified by the item described below.

[Item 1]

A battery module including:

battery 14;

voltage detection line 46 including conductive wire 76 and tab terminal 78 and configured to detect a voltage of battery 14; and support plate 28 that supports voltage detection line 46, support plate 28 including base plate 33 on which voltage detection line 46 is placed, and position restricting structure 80 of tab terminal 78, position restricting structure 80 including receiving surface part 82 against which tab terminal 78 abuts, and biasing part 84 that pushes tab terminal 78 toward receiving surface part 82.

REFERENCE MARKS IN THE DRAWINGS 14 battery
22 output terminal
28 support plate
33 base plate
42 bus bar
46 voltage detection line
47 voltage detection line module
60 cover plate
76 conductive wire
76a connection end
78 tab terminal
78b joint
80 position restricting structure
82 receiving surface part
84 biasing part
98 eaves part
104 protrusion

The invention claimed is:

1. A support plate, wherein:
the support plate supports a voltage detection line for detecting a voltage of a battery,
the voltage detection line including
a conductive wire, and
a tab terminal that electrically connects the conductive wire to a bus bar electrically connected to an output terminal of the battery,
the support plate comprising:
a base plate on which the voltage detection line is placed; and
a position restricting structure that restricts a position of the tab terminal to a prescribed position in which the tab terminal overlaps the bus bar in a thickness direction of the tab terminal,
wherein the position restricting structure includes a receiving surface part against which the tab terminal abuts, and a biasing part that pushes the tab terminal toward the receiving surface part,
the conductive wire includes a connection end extending in a first direction perpendicular to the thickness direction,
the tab terminal includes:
a fixing part extending in the first direction and connected to the connection end, and
a joint extending from the fixing part in a second direction intersecting the first direction and perpendicular to the thickness direction, the joint joined to the bus bar,
the receiving surface part and the biasing part sandwich the joint in the first direction and an opposite direction to the first direction, wherein the joint abuts against the receiving surface part in the opposite direction.

2. The support plate according to claim 1, wherein the biasing part includes an eaves part that overlaps the tab terminal when viewed in a third direction in which the base plate and the voltage detection line are arranged.

3. A voltage detection line module comprising:
a voltage detection line for detecting a voltage of a battery; and
the support plate according to claim 1 that supports the voltage detection line.

4. The voltage detection line module according to claim 3 further comprising a cover plate placed on the support plate to cover the voltage detection line,
wherein the cover plate includes a protrusion that presses the biasing part against a biasing force of the biasing part in state of the cover plate placed on the support plate.

* * * * *